United States Patent [19]

Vimpari

[11] Patent Number: 5,390,168
[45] Date of Patent: Feb. 14, 1995

[54] RADIO FREQUENCY TRANSMISSION CIRCUIT

[75] Inventor: Markku Vimpari, Oulu, Finland

[73] Assignee: Nokia Mobile Phones Ltd., Salo, Finland

[21] Appl. No.: 947,755

[22] Filed: Sep. 21, 1992

[30] Foreign Application Priority Data

Sep. 25, 1991 [FI] Finland ................. 914510

[51] Int. Cl.6 .......................................... H04B 1/50
[52] U.S. Cl. .................................... 370/30; 455/76; 455/77
[58] Field of Search ............... 331/23; 375/59, 109, 375/120; 379/59; 455/54.1, 78, 79, 95, 120, 125, 126, 42, 73, 76, 77, 85, 86, 87, 88, 89; 370/24, 29, 30, 45.3

[56] References Cited

U.S. PATENT DOCUMENTS

| | | | |
|---|---|---|---|
| 3,882,424 | 5/1975 | Debois et al. .................. | 332/127 |
| 3,942,116 | 3/1976 | Ferguson ........................ | 455/79 |
| 4,259,644 | 3/1981 | Iimura ............................ | 331/2 |
| 4,355,401 | 10/1982 | Ikoma et al. .................. | 455/78 X |
| 4,520,474 | 5/1985 | Vilmur ........................... | 370/24 |
| 5,023,930 | 6/1991 | Leslie ............................. | 455/54.1 X |
| 5,103,459 | 4/1992 | Gilhousen et al. ............. | 455/54.1 X |
| 5,291,474 | 3/1994 | Ikonen et al. ................. | 370/30 |

*Primary Examiner*—Willis R. Wolfe
*Attorney, Agent, or Firm*—Perman & Green

[57] ABSTRACT

A radio frequency transmission circuit comprising a first signal generating means and a second signal generating means, means for modulating one of the first and second signals to produce a modulated signal, and mixer means to combine the other of the first and second signals and the modulated signal to produce an RF output signal. The first signal is controlled by a feed back loop comprising a second mixer having an input from both the first and second signals, whereby fluctuations in the frequency of the second signal are compensated for by adjustment of the first signal so as to maintain the RF output signal at a substantially constant frequency.

10 Claims, 1 Drawing Sheet

RADIO FREQUENCY TRANSMISSION CIRCUIT

The invention relates to a radio frequency (RF) transmission circuit for maintaining the frequency of the RF output signal substantially constant.

BACKGROUND OF THE INVENTION

In a digital radio telephone a pulsed transmitter is generally used, the radio frequency (RF) signal being generated in a phase-locked loop the reference frequency of which is obtained from a high-accuracy crystal oscillator, for example a voltage-controlled temperature-compensated crystal oscillator (VCTCXO). In this case the voltage-controlled oscillator of the transmitter cannot operate at the same frequency as the RF output signal, because the pulsing of the transmitter would cause excessive variation in the output frequency. Likewise, a phase-locked loop (PLL) is too slow to be able to correct the frequency error of the transmitter to the desired level at the beginning of the transmission time slot. Thus, digital modulation, for example Quadrature Pulse Shift Keying (QPSK) modulation, is performed more easily at a carrier frequency lower than the RF output frequency. For this reason, a system has been used in which modulation is performed at a lower intermediate frequency (VHF), which is then mixed with an unmodulated UHF frequency to produce the RF output signal.

Such a system requires the frequency of both the unmodulated (UHF) signal and the intermediate frequency (VHF) signal, to have a high degree of accuracy. In practice, the intermediate frequency signal and the UHF signal are each generated in a synthesizer or a VCTCXO, in which case the circuitry will be expensive, since, for example, the VCTCXO is an expensive special component.

SUMMARY OF THE INVENTION

According to the present invention there is provided, a radio frequency (RF) transmission circuit comprising means for generating a first signal having a first frequency, means for generating a second signal having a second frequency, means for modulating one of said first and second signals with a further signal to produce a modulated signal, first mixer means for combining the other of said first and second signals with the modulated signal to produce an RF output signal, and a feedback circuit associated with the first signal generating means for controlling the frequency of the first signal, characterized by second mixer means associated with the first signal generating means for combining the first signal and the second signal to produce a combined signal, and the second mixer means being included in the feedback circuit associated with the first signal generating means, whereby the first signal is adjusted to compensate for variations in the second signal by maintaining the frequency of the combined signal substantially constant and thereby maintaining the frequency of the RF output signal substantially constant.

An advantage of the present invention is that the RF output signal may be maintained at a substantially constant frequency with the use of only one accurate signal generator. In other words only one of the two signals must be controlled accurately and fluctuations in the frequency of the other signal may be compensated for by making corresponding adjustments to the frequency of the other signal. Thus space may be conserved within a small device such as a mobile radio telephone, and manufacturing costs may be reduced.

BRIEF DESCRIPTION OF THE DRAWING

An embodiment of the present invention will now be described by way of example, with reference to the accompanying drawing.

DETAILED DESCRIPTION OF THE INVENTION

Figure 1:
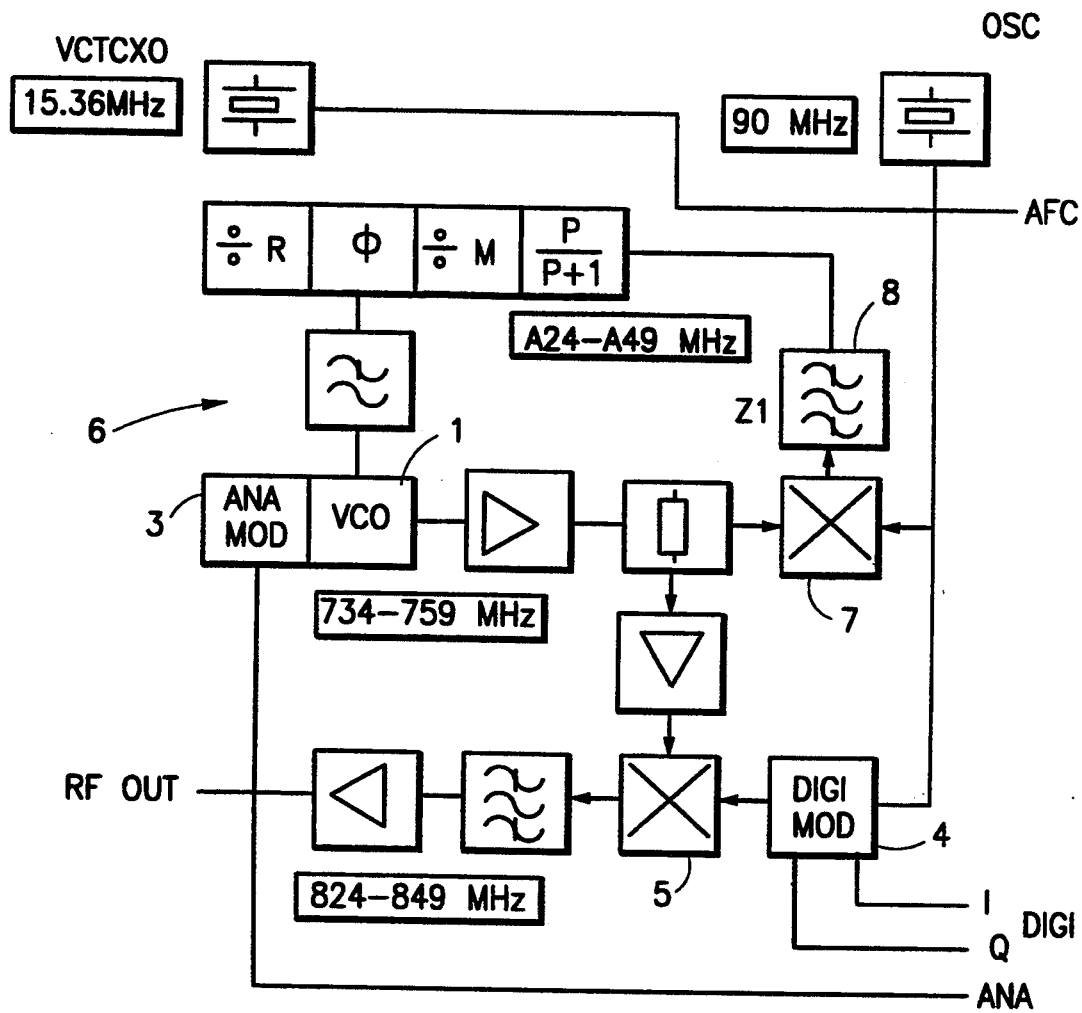

As illustrated in the drawing the radio frequency (RF) transmission circuit comprises means for generating a first signal in the form of a voltage controlled oscillator 1, means for generating a second signal in the form of an oscillator 2, and means 3 and 4 for modulating one of said first and second signals with a further signal to produce a modulated signal. First mixer means 5 is provided for combining the other of said first and second signals with the modulated signal to produce an RF output signal. A feed back circuit, shown generally at 6, is associated with the first signal generating means, voltage controlled oscillator 1, for controlling the frequency of the first signal. Further a second mixer means 7 is included in the feedback circuit 6, the input of the second mixer means 7 being the first and second signals. The output of the second mixer means 7 being coupled via a band pass filter 8 to the remainder of a phase locked loop, whereby the first signal is adjusted to compensate for variations in the second signal by maintaining the frequency of the combined signal substantially constant and thereby maintaining the frequency of the RF output signal substantially constant.

When in use, a digital I-Q (In phase - Quadrature) signal DIG to be transmitted modulates an intermediate frequency signal from the second signal generating means 2 which is then forwarded to the mixer (DIGIMOD) 4. The second signal generating means 2 is a 90 MHz oscillator OSC. The modulated signal is mixed with the first signal which is an unmodulated radio frequency signal (734–759 MHz) in a mixer 5 in order to form the RF radio output signal in the frequency range (824–849 MHz).

The first signal, produced in association with the feedback circuit 6, is selected to be the difference between the RF output frequency (824–849 MHz) and the intermediate frequency (90 MHz);

The first signal (unmodulated intermediate frequency signal at 90 MHz) is fed to the second mixer 7 in the feedback circuit 6, the second input of the mixer being the first signal (a radio-frequency signal in the range 734–759 MHz), and the output of the mixer 7 is fed via a pre-divider to a phase detector in the phase-locked loop PLL. The reference frequency applied to the phase detector is obtained via the reference divider from a VCTCXO, the frequency of which in this example is 15.36 MHz.

As compared with prior-art systems, the arrangement comprises an additional mixer 7, and a band-pass filter 8, which may both be of quite simple construction.

The other parts of the circuit arrangement as illustrated in the figure are known to the person skilled in the art, and therefore their operation is not explained here in detail.

An advantage of the invention is that fluctuations in the frequency of the intermediate frequency signal from the second signal generating means, which may be due to temperature variations or individual variations, do not affect the frequency of the RF output signal. The accuracy of the output frequency is dependent only on the VCTCXO, which generates the frequency-synthesizer reference. From this it follows that the frequency of the second signal generating means 2 need not be tuned in manufacture or maintenance, or during use.

The reference oscillator (VCTCXO) used may be, for example, a 15.36 MHz standard component, which is common in AMPS mobile telephones.

Digital modulation, for example QPSK modulation, can be performed at the required intermediate (VHF) frequency even if the VHF signal error has been compensated for in the feed back circuit. This is possible, since the signal mixed with the first signal in the mixer 7 has not been modulated. (A modulated signal cannot be fed to a phase locked loop.) The modulation may also be some other than QPSK modulation.

The RF output frequency differs from the frequency of the voltage controlled oscillator (VCO) in the PLL. In this case it suffices that the pro-divider of the synthesizer locks onto the correct frequency, the required attenuation with respect to the VCO frequency being less than 10 dB.

Analogue modulation can further be carried out in a known manner so that the analogue signal ANA to be transmitted modulates, in a known manner, the signal from the voltage-controlled oscillator 1, in which case the intermediate frequency is not modulated.

In view of the foregoing it will be clear to a person skilled in the art that modifications may be incorporate without departing from the scope of the present invention.

I claim:

1. A radio frequency (RF) transmission circuit comprising:

means for generating a first signal having a first frequency, means for generating a second signal having a second frequency, means for modulating one of said first and second signals with a further signal to produce a modulated signal, first mixer means for combining the other of said first and second signals with the modulated signal to produce an RF output signal, and a feedback circuit associated with the first signal generating means for controlling the frequency of the first signal, characterized by second mixer means associated with the first signal generating means for combining the first signal and the second signal to produce a combined signal, and the second mixer means being included in the feedback circuit associated with the first signal generating means, whereby the first signal is adjusted to compensate for variations in the second signal by maintaining the frequency of the combined signal substantially constant and thereby maintaining the frequency of the RF output signal substantially constant.

2. A radio frequency transmission circuit as claimed in claim 1, wherein the first signal has a frequency in the UHF range.

3. A radio frequency transmission circuit as claimed in claim 1, wherein the second signal is an intermediate frequency signal.

4. A radio frequency transmission circuit as claimed in claim 1, wherein the modulation means utilizes digital modulation.

5. A radio frequency transmission circuit as claimed in claim 4, wherein the digital modulation utilized involves Quadrature Phase Shift Keying.

6. A radio frequency transmission circuit as claimed in claim 1, wherein the modulation means utilizes analogue modulation.

7. A radio frequency transmission circuit as claimed in claim 1, wherein the feedback circuit comprises a Phase Locked Loop to which a substantially constant reference frequency may be applied.

8. A radio frequency transmission circuit as claimed in claim 7, wherein the reference frequency is generated by a Voltage Controlled Oscillator.

9. A radio frequency transmission circuit as claimed in claim 1, wherein the feedback circuit comprises a filter coupled to receive the combined signal from the second mixer means.

10. A radio frequency transmission circuit as claimed in claim 9, wherein the filter is a bandpass filter.

* * * * *